United States Patent
Oh

(10) Patent No.: US 6,187,651 B1
(45) Date of Patent: Feb. 13, 2001

(54) METHODS OF FORMING TRENCH ISOLATION REGIONS USING PREFERRED STRESS RELIEVING LAYERS AND TECHNIQUES TO INHIBIT THE OCCURRENCE OF VOIDS

(75) Inventor: Yong-Chul Oh, Kyunggi-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/306,496

(22) Filed: May 6, 1999

(30) Foreign Application Priority Data

May 7, 1998 (KR) .................................................. 98-16334

(51) Int. Cl.[7] ..................................................... H01L 21/76
(52) U.S. Cl. ............................. 438/435; 438/296; 438/424
(58) Field of Search .................................... 438/424, 296, 438/425, 433, 435

(56) References Cited

U.S. PATENT DOCUMENTS

| | | | |
|---|---|---|---|
| 5,189,501 | 2/1993 | Kawamura et al. | 257/647 |
| 5,190,889 | 3/1993 | Poon et al. | 437/67 |
| 5,206,182 | 4/1993 | Freeman | 437/33 |
| 5,316,965 | * 5/1994 | Philipossian et al. | 438/424 |
| 5,447,884 | 9/1995 | Fahey et al. | 437/67 |
| 5,521,422 | 5/1996 | Mandelman et al. | 257/510 |
| 5,554,256 | 9/1996 | Jruijmboom et al. | 156/643.1 |
| 5,578,518 | 11/1996 | Koike et al. | 437/67 |
| 5,677,234 | 10/1997 | Koo et al. | 437/69 |
| 5,712,185 | 1/1998 | Tsai et al. | 437/67 |
| 5,750,433 | 5/1998 | Jo | 438/424 |
| 5,753,562 | 5/1998 | Kim | 438/424 |
| 5,786,262 | * 7/1998 | Jang et al. | 438/424 |
| 5,834,358 | 11/1998 | Pan et al. | 438/424 |
| 5,837,595 | 11/1998 | Ahn et al. | 438/443 |
| 5,837,612 | 11/1998 | Ajuria et al. | 438/697 |
| 5,858,842 | 1/1999 | Park | 438/297 |
| 5,863,827 | 1/1999 | Joyner | 438/425 |
| 5,885,883 | 3/1999 | Park et al. | 438/435 |
| 5,994,200 | * 11/1999 | Kim | 438/425 |
| 6,001,707 | * 12/1999 | Lin et al. | 438/424 |
| 6,004,862 | * 12/1999 | Kim et al. | 438/425 |
| 6,008,108 | * 12/1999 | Huang et al. | 438/424 |
| 6,030,882 | * 2/2000 | Hong | 438/424 |
| 6,037,237 | * 3/2000 | Park et al. | 438/424 |
| 6,057,208 | * 5/2000 | Lin et al. | 438/424 |

FOREIGN PATENT DOCUMENTS 61-137338    6/1986    (JP) .

* cited by examiner

Primary Examiner—Charles Bowers
Assistant Examiner—David S Blum
(74) Attorney, Agent, or Firm—Myers Bigel Sibley & Sajovec

(57) ABSTRACT

Methods of forming trench isolation regions include the steps of forming a trench in a semiconductor substrate and lining the trench with a first electrically insulating layer. A stress-relief nitride layer is then formed on the first electrically insulating layer, opposite sidewalls of the trench. The trench is then filled with a second electrically insulating layer. The second electrically insulating layer is then planarized. This is followed by the steps of etching the stress-relief nitride layer and then forming a third electrically insulating layer on the planarized second electrically insulating layer and on the stress-relief nitride layer. The step of forming the trench is preferably preceded by the step of forming a patterned pad nitride layer on the semiconductor substrate. The pad nitride layer may be used as a mask when etching the substrate to define the trench. The step of planarizing the second electrically insulating layer may also comprise the step of planarizing the second electrically insulating layer using the patterned pad nitride layer as an etch stop.

14 Claims, 6 Drawing Sheets

METHODS OF FORMING TRENCH ISOLATION REGIONS USING PREFERRED STRESS RELIEVING LAYERS AND TECHNIQUES TO INHIBIT THE OCCURRENCE OF VOIDS

RELATED APPLICATION

This application is related to Korean Application No. 98-16334, filed May 5, 1998, the disclosure of which is hereby incorporated herein by reference.

FIELD OF THE INVENTION

This invention relates to integrated circuit device fabrication methods and, more particularly, to methods of forming field oxide isolation regions in semiconductor substrates.

BACKGROUND OF THE INVENTION

Improved active device isolation techniques are required in order to facilitate ongoing attempts to increase integration density in integrated circuit devices by designing devices having reduced unit cell size. Conventional device isolation techniques include local oxidation of silicon (LOCOS) and shallow trench isolation (STI) techniques, for example. Such device isolation techniques are disclosed in U.S. Pat. Nos. 5,677,234, 5,750,433, 5,753,562, 5,837,595, 5,858,842 and 5,885,883.

But, such techniques as LOCOS may not be appropriate for current high integration devices because they typically result in the formation of isolation regions having bird's beak oxide extensions which may consume relatively large amounts of area and thereby impede attempts for higher integration levels. To address this and other problems, STI techniques have been developed. One such technique is illustrated by FIGS. 1A–1E. In particular, FIG. 1A illustrates the steps of forming a pad oxide layer 3, a pad nitride layer 4, a high temperature oxide (HTO) layer 5 and an anti-reflective layer 6 on a semiconductor substrate 2. A photoresist layer 10 is then patterned on the anti-reflective layer 6. A trench mask 8 is then formed by performing an etching step using the patterned photoresist layer 10 as an etching mask. As illustrated by FIG. 1B, another etching step is then performed to define a trench 12 in the substrate 2, using the trench mask 8 as a etching mask. During the etching step, the anti-reflective layer 6 may also be removed.

Referring now to FIG. 1C, a thermal oxide layer 14 is then formed in the trench to remove etching damage. A trench isolation layer comprising an undoped silicate glass (USG) layer 15 and a PE-TEOS oxide layer 16 (for reducing stress in the USG layer), is then formed to fill the trench 12. As illustrated by FIG. 1D, a planarization step (e.g., CMP) is then performed, using the pad nitride layer 4 as an etch stop layer. Then, as illustrated by FIG. 1E, the pad nitride layer 4 and pad oxide layer 3 are sequentially removed to define a trench isolation region 18.

Unfortunately, because the substrate 2 may have a substantially different coefficient of thermal expansion than the USG layer 15 in the trench 12, substantial stresses may develop in the substrate 2 during back-end processing. These stresses may adversely influence the device characteristics of active devices formed in active regions adjacent the trench isolation region 18. The subsequent formation of an oxide layer on the active regions (e.g., gate oxide layers) may also act to increase the degree of stress in the substrate 2, due to volume expansion in the trench isolation region 18. Grain dislocation defects may also be generated at the bottom corners and sidewalls of the trench in response to the volume expansion. Such defects may lead to increases in junction leakage currents in adjacent active devices, and decreases in reliability and yield.

Thus, notwithstanding the above described methods, there continues to be a need for improved methods of forming field oxide isolation regions.

SUMMARY OF THE INVENTION

It is therefore an object of the present invention to provide improved methods of forming field oxide isolation regions.

It is another object of the present invention to provide methods of forming field oxide isolation regions having reduced susceptibility to void defects therein.

It is still another object of the present invention to provide methods of forming trench isolation regions having low stress characteristics.

These and other objects, advantages and features of the present invention are provided by methods of forming trench isolation regions that include the steps of forming a trench in a semiconductor substrate and lining the trench with a first electrically insulating layer. A stress-relief nitride layer is then formed on the first electrically insulating layer, opposite sidewalls of the trench. The trench is then filled with a second electrically insulating layer. The second electrically insulating layer is then planarized. This is followed by the steps of etching the stress-relief nitride layer and then forming a third electrically insulating layer on the planarized second electrically insulating layer and on the stress-relief nitride layer. According to a preferred aspect of the present invention, the step of forming the trench is preceded by the step of forming a patterned pad nitride layer on the semiconductor substrate. The pad nitride layer may be used as a mask when etching the substrate to define the trench. The step of planarizing the second electrically insulating layer may also comprise the step of planarizing the second electrically insulating layer using the patterned pad nitride layer as an etch stop. Furthermore, the step of etching the stress-relief nitride layer may comprise etching the patterned pad nitride layer to expose sidewalls of the second electrically insulating layer. The step of forming a third electrically insulating layer may also comprise forming a high temperature oxide layer on the exposed sidewalls of the second electrically insulating layer, and may be followed by the step of etching the second and third electrically insulating layers simultaneously to define a trench isolation region in the trench. According to other preferred aspects of the present invention, the stress-relief nitride layer may comprise $Si_4N_4$ and the step of filling the trench with a second electrically insulating layer may comprise filling the trench with an undoped silicate glass layer. The step of planarizing the second electrically insulating layer may also be preceded by the step of annealing the undoped silicate glass layer to increase its density.

DESCRIPTION OF PREFERRED EMBODIMENTS

Figure 1A:
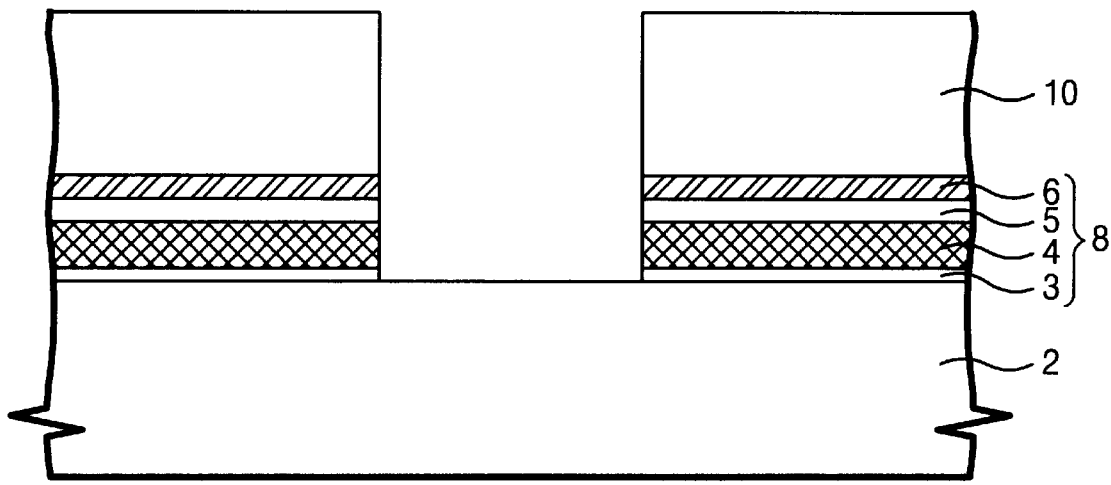
FIGS. 1A–1E are cross-sectional views of intermediate structures that illustrate a method of forming a trench isolation region in accordance with the priori
Figure 1B:
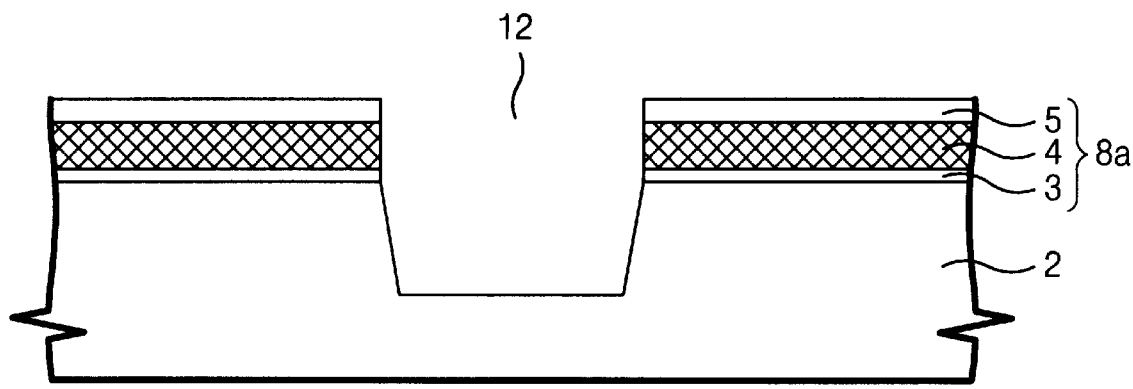
Figure 1C:
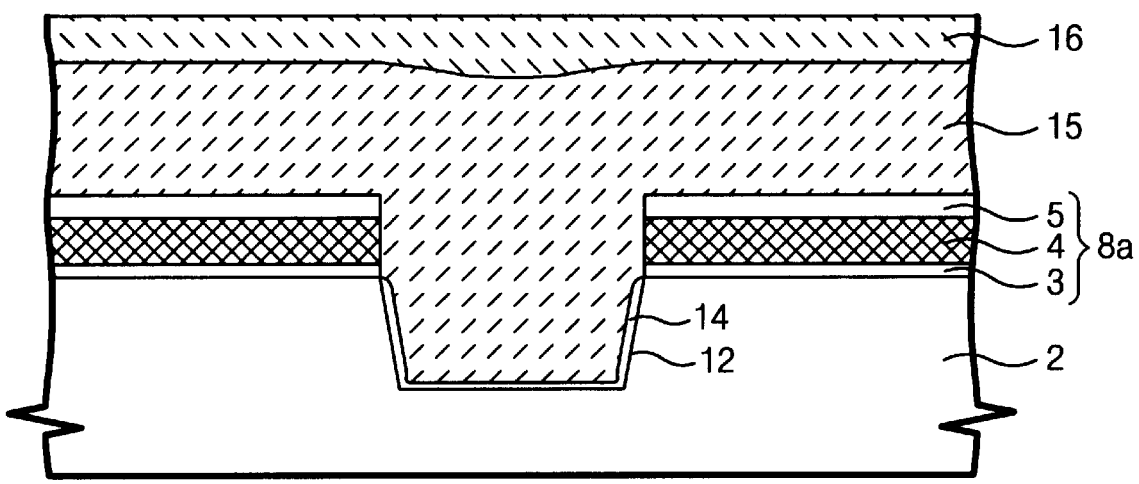
Figure 1D:
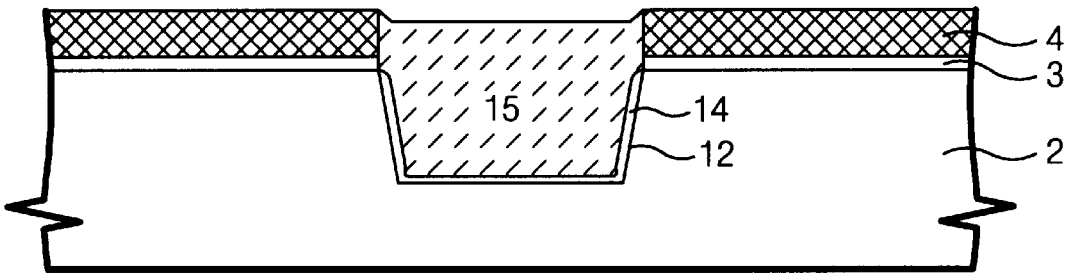
Figure 1E:
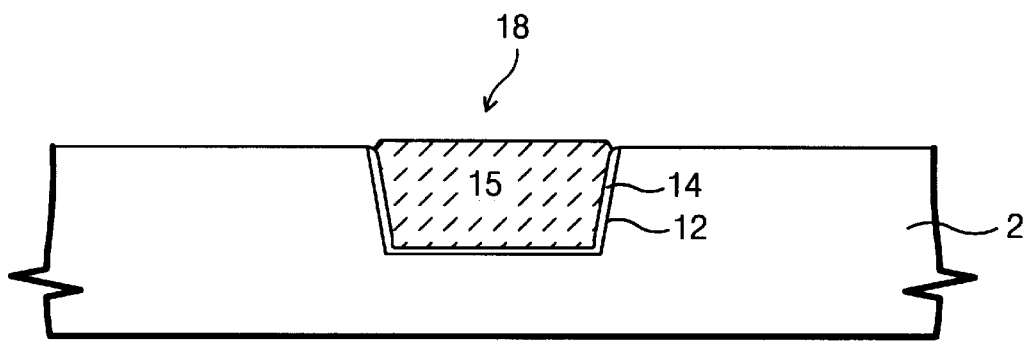

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2A:
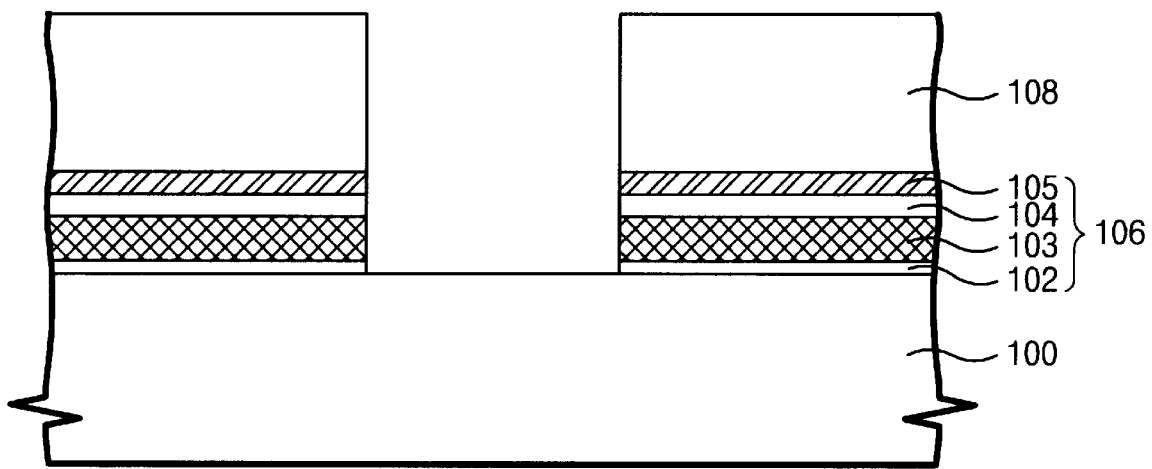
FIGS. 2A–2F are cross-sectional views of intermediate structures that illustrate methods of forming trench isolation regions in accordance with a preferred embodiment of the present invention.

Referring now to FIGS. 2A–2F, preferred methods of forming trench isolation regions in integrated circuit substrates will be described. In particular, FIG. 2A illustrates the steps of forming a pad oxide layer 102 on a surface of a semiconductor substrate 100. The pad oxide layer 102 may be formed to have a thickness in a range between 70 Å and 160 Å using a thermal oxidation process. A pad nitride layer 103 and a high temperature oxide (HTO) layer 104 are also formed on the pad oxide layer 102. In addition, an anti-reflective layer 105 is formed on the HTO layer 104. The pad nitride layer 103 may be deposited to have a thickness of about 1500 Å and the HTO layer 104 may be deposited to have a thickness of about 500 Å. The anti-reflective layer 105 may comprise silicon oxynitride (SiON) and may be deposited to a thickness of about 600 Å. According to a preferred aspect of the present invention, the anti-reflective layer 105 is utilized to enhance process uniformity (e.g., alignment) when performing a photolithographically defined etching step during subsequent processing.

Referring still to FIG. 2A, a photoresist layer 108 is then formed on the anti-reflective layer 105. The photoresist layer 108 is photolithographically patterned using conventional photolithography techniques. A dry etching step is then preferably performed to define a trench mask 106. In particular, the anti-reflective layer 105, the HTO layer 104, the pad nitride layer 103 and the pad oxide layer 102 are etched in sequence using the patterned photoresist layer 108 as an etching mask.

Figure 2B:
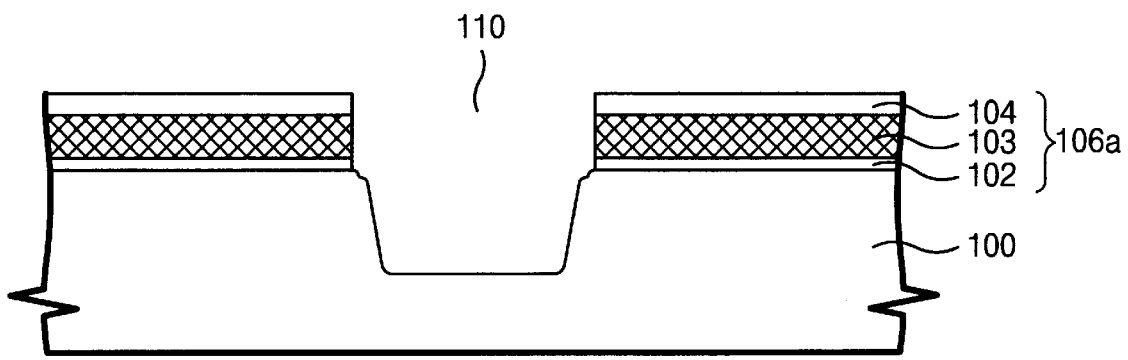

Referring now to FIG. 2B, the photoresist layer 108 is then removed using a conventional washing technique. Another dry etching step is then performed to define a trench 110, using the trench mask 106 as an etching mask. The trench 110 may be formed to have a depth in a range between about 0.1 and 1.5 µm, and more preferably about 0.25 µm. Depending on the dry etch process conditions, the upper portions of the sidewalls of the trench 110 may be tapered, as illustrated. Such tapering of the sidewalls can inhibit the occurrence of gate oxide thinning during subsequent processing steps, and is therefore preferred. During the etching step, the anti-reflective layer 105 may also be removed.

Figure 2C:
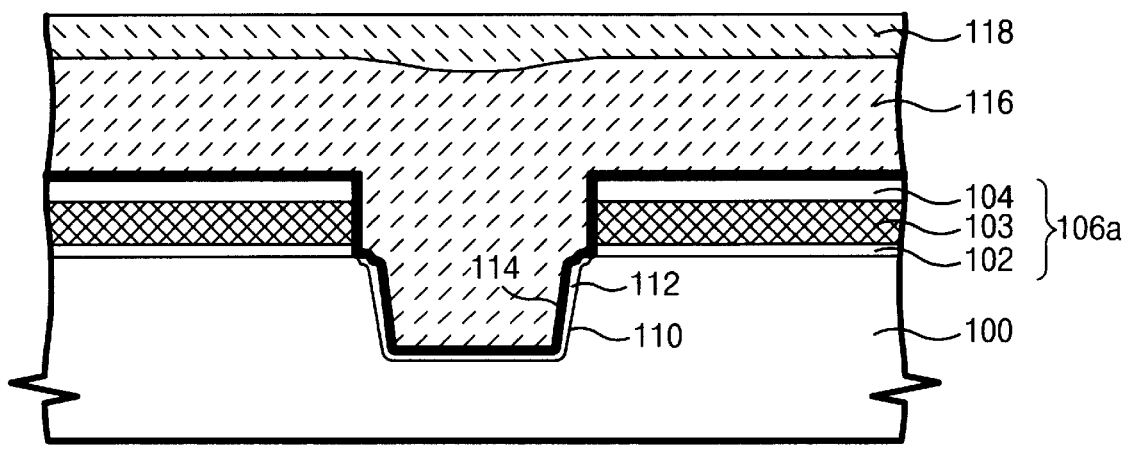

Referring now to FIG. 2C, a thermal oxide layer 112 having a thickness in a range between about 50 Å and 500 Å is then formed on the bottom and sidewalls of the trench 110 in order to remove silicon grain defects which may have been formed in the substrate 100 during the step of etching the trench. The thickness of the thermal oxide layer 112 may not be uniform on the bottom and sidewalls of the trench 110. Next, a blanket nitride layer 114 having a thickness in a range between about 30 Å and 300 Å, is formed on the thermal oxide layer 112 and on the trench masking layer 106a, as illustrated, using a low pressure chemical vapor deposition (LPCVD) technique. This blanker nitride layer 114 is preferably formed to prevent further oxidation of the sidewalls and bottom of the trench and also act as a stress relieving/buffer layer when the trench 110 is filled during subsequent processing steps. The blanket nitride layer 114 may comprise a silicon nitride layer ($Si_3N_4$) or, more preferably, a silicon-rich silicon nitride layer ($Si_4N_4$) which has relatively less internal stress.

A trench isolation layer 116 is then formed on the blanket nitride layer 114, as illustrated. The trench isolation layer 116 may comprise an undoped silicate glass (USG) layer ($O_3$-TEOS) having good conformal deposition characteristics. The trench isolation layer 116 may be formed to have a thickness of about 5000 Å, particularly if the trench has a depth of about 0.25 µm. To offset the stress characteristics that may be associated with the trench isolation layer 116, an electrically insulating layer 118 of plasma-enhanced tetraethylorthosilicate glass (PE-TEOS) or a plasma-enhanced oxide (PE-OX) may be formed on the trench isolation layer 116. Then, during a step to planarize the electrically insulating layer 118, an annealing step is also preferably performed to densify the USG layer 116 and prevent an over-recess condition from occurring due to the presence of the trench 110. This annealing step may be performing in an $N_2$ ambient at a high temperature of about 900° C. or more, or in a wet ambient ($H_2$ and $O_2$ ambient) at a temperature of about 850° C. or less (e.g., 700° C.).

Figure 2D:
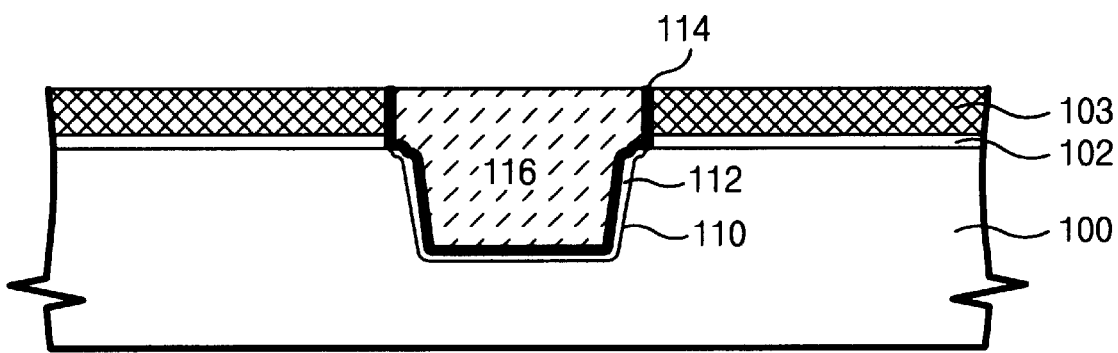

Referring now to FIG. 2D, a planarization step is then performed to planarize the trench isolation layer 116, using the pad nitride layer 103 as an etch stop layer. This planarization step may be performed using a chemical-mechanical polishing (CMP) technique. As illustrated, this planarization step may expose portions of the blanket nitride layer 114 that extends into the trench 110.

Figure 2E:
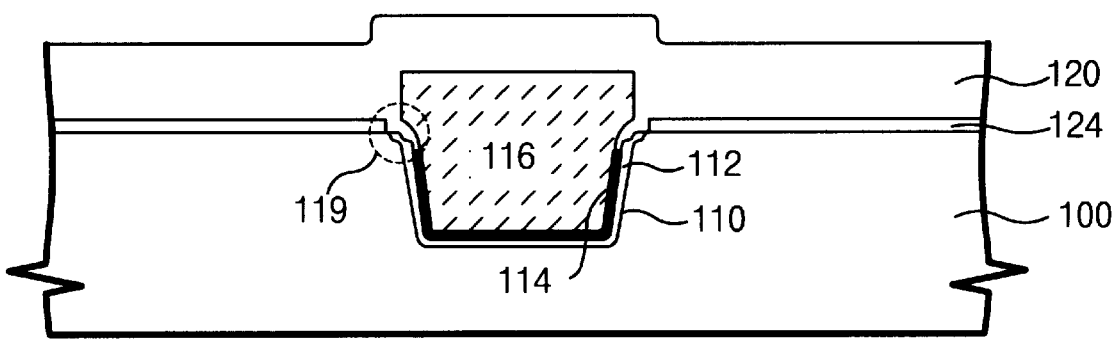
Figure 2F:
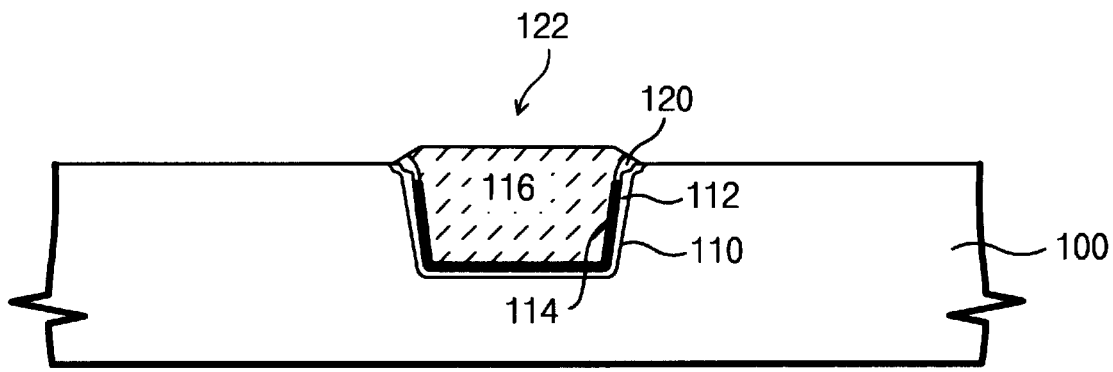

Referring now to FIG. 2E, the pad nitride layer 103 is then removed using a wet etching technique and an etching solution such as phosphoric acid. During this wet etching step, unwanted recesses or voids 119 may also be formed between the trench isolation layer 116 and sidewalls of the trench 110. This is because portions of the exposed nitride layer 114 may also be etched as the pad nitride layer 103 is being etched. As will be understood by those skilled in the art, such recesses or voids 119 may lead to the formation of unwanted poly-stringers during subsequent gate electrode formation steps and may result in unwanted gate oxide thinning at the edges of the active regions of the substrate 100. In order to prevent these recesses or voids from having parasitic effects on the reliability and device characteristics of devices formed in the active regions, a high temperature oxide (HTO) layer 120 of sufficient thickness is formed to fill the recesses 119. In particular, the HTO layer 120 is preferably a low pressure (LP) TEOS oxide layer having a thickness in a range between about 100 and 500 Å. The HTO layer 120 and trench isolation layer 116 are then etched-back to expose the substrate 100 and define a resulting trench isolation layer 122, as illustrated by FIG. 2F. This etch-back step may be performed using a dry etching step or a more preferred wet etching step.

Figure 3:
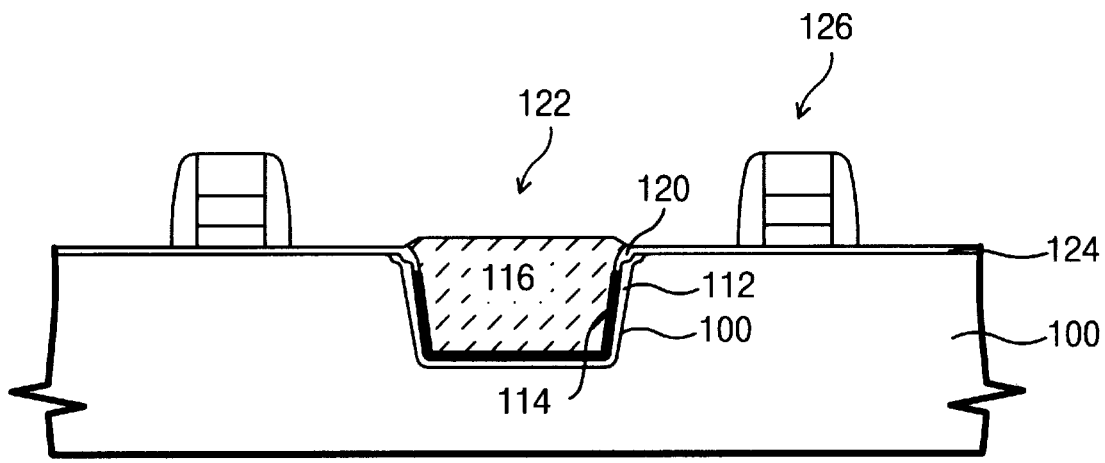
FIG. 3 is a cross-sectional view of an integrated circuit substrate having a trench isolation region therein formed in accordance with a method of FIGS. 2A–2F.

Referring now to FIG. 3, a gate oxide insulating layer 124 and a plurality of gate electrodes 126 of respective active devices are then formed on the substrate 100, using conventional techniques. These active devices can have preferred characteristics because the trench isolation regions formed in accordance with the above described methods act to inhibit stress in and adjacent the field oxide isolation regions by, among other things, inhibiting oxide volume expansion. The inclusion of an HTO layer 120 during processing is also preferred to inhibit void formation and reduce the likelihood that parasitic stringers will be formed when the gate electrodes are patterned.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a trench isolation region, comprising the steps of:

forming a trench in a semiconductor substrate;

lining a sidewall of the trench with a first electrically insulating layer;

forming a stress-relief layer on the first electrically insulating layer;

filling the trench with a second electrically insulating layer;

planarizing the second electrically insulating layer; then etching the stress-relief layer to define a recess that extends below a surface of the semiconductor substrate and between the second electrically insulating layer and a portion of the first electrically insulating layer lining the sidewall of the trench;

forming a third electrically insulating layer that extends on the planarized second electrically insulating layer and extends into the recess; and simultaneously etching back the third electrically insulating layer and the planarized second electrically insulating layer to define an isolation region.

2. The method of claim 1, wherein said step of forming a trench is preceded by the step of forming a patterned pad layer on the semiconductor substrate; and wherein said step of forming a trench comprises etching the semiconductor substrate using the patterned pad layer as an etching mask.

3. The method of claim 2, wherein said step of planarizing the second electrically insulating layer comprises planarizing the second electrically insulating layer using the patterned pad layer as an etch stop.

4. The method of claim 3, wherein said step of forming a third electrically insulating layer comprises forming a high temperature oxide layer in the recess.

5. The method of claim 1, wherein the stress-relief layer comprises $Si_4N_4$.

6. The method of claim 1, wherein said step of filling the trench with a second electrically insulating layer comprises filling the trench with an undoped silicate glass layer; and wherein said step of planarizing the second electrically insulating layer is preceded by the step of annealing the undoped silicate glass layer to increase its density.

7. The method of claim 6, wherein said annealing step comprises annealing the undoped silicate glass layer at a temperature of more than about 900° C. in an $N_2$ ambient.

8. The method of claim 6, wherein said annealing step comprises annealing the undoped silicate glass layer in a wet ambient at a temperature of no more than about 850° C.

9. A method of forming a trench isolation region, comprising the steps of:

forming a pad oxide layer on a surface of a semiconductor substrate;

forming a pad nitride layer on the pad oxide layer, opposite the surface;

patterning the pad nitride layer and the pad oxide layer to define a trench mask;

forming a trench in the semiconductor substrate by etching the semiconductor substrate using the trench mask as an etching mask;

oxidizing a bottom and sidewalls of the trench to form a first electrically insulating layer thereon;

forming a stress-relief nitride layer on the first electrically insulating layer, opposite sidewalls of the trench; then filling the trench with a second electrically insulating layer;

planarizing the second electrically insulating layer using the patterned pad nitride layer as an etch stop; then etching the patterned pad nitride layer and the stress-relief nitride layer to define a recess that extends below a surface of the semiconductor substrate and between the second electrically insulating layer and the first electrically insulating layer; and forming a third electrically insulating layer that extends on the planarized second electrically insulating layer and extends into the recess.

10. The method of claim 9, wherein said step of forming a third electrically insulating layer is followed by the step of etching the second and third electrically insulating layers to define a trench isolation region in the trench.

11. The method of claim 9, wherein the stress-relief nitride layer comprises $Si_4N_4$.

12. The method of claim 9, wherein said step of filling the trench with a second electrically insulating layer comprises filling the trench with an undoped silicate glass layer; and wherein said step of planarizing the second electrically insulating layer is preceded by the step of annealing the undoped silicate glass layer to increase its density.

13. The method of claim 12, wherein said annealing step comprises annealing the undoped silicate glass layer at a temperature of more than about 900° C. in an $N_2$ ambient.

14. The method of claim 12, wherein said annealing step comprises annealing the undoped silicate glass layer in a wet ambient at a temperature of no more than about 850° C.

* * * * *